(12) United States Patent
Yang et al.

(10) Patent No.: US 9,559,690 B2
(45) Date of Patent: Jan. 31, 2017

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Haisheng Wang, Beijing (CN); Hailin Xue, Beijing (CN); Yingming Liu, Beijing (CN); Weijie Zhao, Beijing (CN); Hongjuan Liu, Beijing (CN); Xiaoliang Ding, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 20 days.

(21) Appl. No.: 14/443,280

(22) PCT Filed: Oct. 1, 2014

(86) PCT No.: PCT/CN2014/088083
§ 371 (c)(1),
(2) Date: May 15, 2015

(87) PCT Pub. No.: WO2015/180359
PCT Pub. Date: Dec. 3, 2015

(65) Prior Publication Data
US 2016/0294386 A1    Oct. 6, 2016

(30) Foreign Application Priority Data

May 30, 2014    (CN) .......................... 2014 1 0239888

(51) Int. Cl.
*H01L 29/00*    (2006.01)
*H03K 17/96*    (2006.01)
(Continued)

(52) U.S. Cl.
CPC ............. *H03K 17/962* (2013.01); *G06F 3/044* (2013.01); *G06F 3/0416* (2013.01);
(Continued)

(58) Field of Classification Search
CPC ...... H03K 17/962; G06F 3/0416; G06F 3/044; H01L 23/3171; H01L 27/12
(Continued)

(56) References Cited

U.S. PATENT DOCUMENTS

2007/0018164 A1    1/2007    Ishikawa
2013/0135247 A1    5/2013    Na et al.
(Continued)

FOREIGN PATENT DOCUMENTS

CN    103279244 A    9/2013
CN    103353819 A    10/2013
(Continued)

OTHER PUBLICATIONS

International Search Report mailed Feb. 26, 2015; PCT/CN2014/088083.
(Continued)

*Primary Examiner* — Ori Nadav
(74) *Attorney, Agent, or Firm* — Ladas & Parry LLP

(57) ABSTRACT

An array substrate and a manufacturing method thereof, and a display device are provided. The array substrate comprises: a gate electrode (11) and a gate line (12) located on a base substrate (00); an active layer (20) located on a film layer where the gate electrode (11) and the gate line (12) are located; a drain electrode (31), a source electrode (32) and a data line (33) located on the active layer (20); a pixel
(Continued)

electrode (40) located on a film layer where the drain electrode (31), the drain electrode (32) and the data line (33) are located and connected to the drain electrode (31) through a first via hole (100); and a common electrode layer (50) located on a film layer where the pixel electrode (40) is located and insulated from the pixel electrode (40); wherein, the common electrode layer (50) includes a plurality of self-capacitive electrodes (51) disposed on a same layer and mutually insulated; the array substrate further comprises: a plurality of conducting lines (60), located on the film layer where the drain electrode (31), the source electrode (32) and the data line (33) are located, and insulated from the drain electrode (31), the source drain (32), the data line (33) and the pixel electrode (40); and, disposed on a layer different from the common electrode layer (50), and each of the conducting lines (60) being electrically connected to a corresponding self-capacitive electrode (51) through a second via hole (200).

20 Claims, 5 Drawing Sheets

(51) Int. Cl.
*H01L 27/12* (2006.01)
*H01L 23/31* (2006.01)
*G06F 3/041* (2006.01)
*G06F 3/044* (2006.01)

(52) U.S. Cl.
CPC .......... *H01L 23/3171* (2013.01); *H01L 27/12* (2013.01); *G06F 2203/04103* (2013.01)

(58) Field of Classification Search
USPC ........................................................ 257/532
See application file for complete search history.

(56) References Cited

U.S. PATENT DOCUMENTS

2013/0249820 A1  9/2013  Woo et al.
2013/0257794 A1  10/2013  Lee et al.

FOREIGN PATENT DOCUMENTS

| CN | 103364983 A | 10/2013 |
| CN | 103365007 A | 10/2013 |
| CN | 103793120 A | 5/2014 |
| CN | 103809807 A | 5/2014 |
| CN | 104022127 A | 9/2014 |

OTHER PUBLICATIONS

Written Opinion of the International Searching Authority dated Feb. 15, 2015; PCT/CN2014/088083.
First Chinese Office Action dated Apr. 5, 2016; Appln. No. 201410239888.4.

ARRAY SUBSTRATE AND MANUFACTURING METHOD THEREOF, AND DISPLAY DEVICE

TECHNICAL FIELD

Embodiments of the invention relate to an array substrate and a manufacturing method thereof, and a display device.

BACKGROUND

Along with rapid development of a display technology, a Touch Screen Panel has been widely used in human life. At present, a touch structure contained in the touch screen panel may be divided into: a mutual-capacitive touch structure and a self-capacitive touch structure. The self-capacitive touch structure is favored by a majority of panel manufacturers due to its touch sensing accuracy and high signal to noise ratio.

Currently, the self-capacitive touch structure detects a finger touch position on self-capacitance principle, which is: a plurality of self-capacitive electrodes disposed on the same layer and independent of each other are arranged in the touch structure; when a human body does not touch a screen, capacitance borne by respective self-capacitive electrodes is a constant value; when the human body touches the screen, the capacitance borne by a corresponding self-capacitive electrode at a touch position is the constant value plus a human body capacitance, and a touch detection chip may determine the touch position by detecting variation of capacitance values of the respective self-capacitive electrodes during a touch period.

In the self-capacitive touch structure, each self-capacitive electrode needs to be connected to the touch detection chip through a separate lead; as illustrated in FIG. 1, each lead specifically includes: a conducting line 2 for connecting a self-capacitive electrode 1 to a frame of the touch screen panel, and a peripheral wire 4 arranged on the frame and configured to conduct the self-capacitive electrode 1 to a wiring terminal 3 of the touch detection chip.

In actual implementation, since there are a large amount of self-capacitive electrodes, correspondingly there are many leads; with each self-capacitive electrode occupying an area of 5 mm*5 mm as example, a 5-inch liquid crystal display screen needs 264 self-capacitive electrodes; if each self-capacitive electrode is designed to be smaller, there will be more self-capacitive electrodes, so more leads should be designed.

Moreover, at the time of designing, in order to reduce the number of film layers, as illustrated in FIG. 1, generally the conducting line 2 in the lead is disposed on the same layer as the self-capacitive electrode 1, so more conducting lines 2 will cause too large touch blind region, wherein the touch blind region refers to a region where the lines are concentrated in the touch screen panel, and signals in such a touch blind region are relatively disordered, so it is called the touch blind region, that is, touch performance in this region cannot be guaranteed.

In summary, the touch blind region in a current self-capacitive touch structure is relatively large, resulting in a worse touch performance of the touch screen panel containing the self-capacitive touch structure.

SUMMARY OF THE INVENTION

The embodiments of the present invention provides an array substrate and a manufacturing method thereof, and a display device, to solve a problem of too large touch blind region in the self-capacitive touch structure in the prior art.

An embodiment according to the present invention provides an array substrate, comprising: a base substrate; a gate electrode and a gate line located on the base substrate; an active layer located on a film layer where the gate electrode and the gate line are located; a drain electrode, a source electrode and a data line located on the active layer; a pixel electrode located on a film layer where the drain electrode, the source electrode and the data line are located and electrically connected to the drain electrode through a first via hole; and a common electrode layer located on a film layer where the pixel electrode is located and electrically insulated from the pixel electrode; wherein, the common electrode layer includes a plurality of self-capacitive electrodes disposed on a same layer and mutually insulated;

the array substrate further comprises:

a plurality of conducting lines, located on the film layer where the drain electrode, the source electrode and the data line are located, and electrically insulated from the drain electrode, the source drain, the data line and the pixel electrode; and, disposed on a layer different from the common electrode layer, and each of the conducting lines being electrically connected to a corresponding self-capacitive electrode through a second via hole.

In one example, a film layer where the conducting lines are located is disposed between the film layer where the drain electrode, the source electrode and the data line are located and the common electrode layer.

In one example, the film layer where the conducting lines are located is disposed between the film layer where the drain electrode, the source electrode and the data line are located and the film layer where the pixel electrode is located.

In one example, a first passivation layer is disposed between the film layer where the drain electrode, the source electrode and the data line are located and the film layer where the pixel electrode is located, and the first via hole runs through the first passivation layer;

the film layer where the conducting lines are located is disposed between the first passivation layer and the film layer where the pixel electrode is located;

the array substrate further comprises:

a first insulating layer, located between the film layer where the conducting lines are located and the film layer where the pixel electrode is located; both the first via hole and the second via hole running through the first insulating layer;

wherein, the pixel electrode is electrically connected to the drain electrode through the first via hole.

In one example, the film layer where the conducting lines are located is disposed between the film layer where the pixel electrode is located and the common electrode layer.

In one example, a second passivation layer is disposed between the film layer where the pixel electrode is located and the common electrode layer;

the film layer where the conducting lines are located is disposed between the second passivation layer and the common electrode layer;

the array substrate further comprises:

a second insulating layer, located between the film layer where the conducting lines are located and the common electrode layer, the second via hole running through the second insulating layer.

In one example, the film layer where the conducting lines are located is disposed above the common electrode layer.

In one example, the array substrate further comprises:

a third insulating layer, located between the film layer where the conducting lines are located and the common electrode layer, the second via hole running through the third insulating layer.

In one example, orthogonal projections of the conducting lines on the base substrate are located in an orthogonal projection of the data line on the base substrate; and/or the orthogonal projections of the conducting lines on the base substrate are located in an orthogonal projection of the gate line on the base substrate.

In one example, the conducting lines serve as common electrode lines for supplying power to the common electrode layer during a display scanning time period.

Another embodiment according to the present invention provides a display device, comprising the array substrate according to any embodiment described above.

Still another embodiment of the present invention provides a manufacturing method of an array substrate, comprising:

Forming a film layer where a gate electrode and a gate line are located, an active layer, and a film layer where a drain electrode, a source electrode and a data line are located, on a base substrate sequentially;

Forming a pixel electrode electrically connected to the drain electrode through a first via hole, a common electrode layer located on a film layer where the pixel electrode is located and electrically insulated from the pixel electrode, and a plurality of conducting lines, on the film layer where the drain electrode, the source electrode and the data line are located;

wherein, the common electrode layer includes a plurality of self-capacitive electrodes disposed on a same layer and mutually insulated; the conducting lines are electrically insulated from the drain electrode, the source electrode, the data line and the pixel electrode, and are disposed on a layer different from the common electrode layer; and each of the conducting lines is connected to a corresponding self-capacitive electrode through a second via hole.

In the embodiments of the present invention, the common electrode layer included in the array substrate includes a plurality of self-capacitive electrodes disposed on the same layer and mutually insulated, and the array substrate further comprises: a plurality of conducting lines electrically connected to corresponding self-capacitive electrodes, so that touch electrodes (i.e., the self-capacitive electrodes) and the conducting lines in the self-capacitive touch structure are embedded in the array substrate, so as to implement an in-cell touch screen panel.

Since the conducting lines are disposed on a layer different from the common electrode layer, the touch blind region in the self-capacitive touch structure can be eliminated, so as to enhance the touch performance of the touch screen panel in the self-capacitive touch structure.

In addition, since the common electrode layer included in the array substrate includes a plurality of self-capacitive electrode disposed on the same layer and mutually insulated, the common electrode layer can serve as the touch electrodes in the self-capacitive touch structure, so as to avoid separately providing a film layer where the touch electrodes are located, thereby reducing the number of film layers.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

Figure 1:
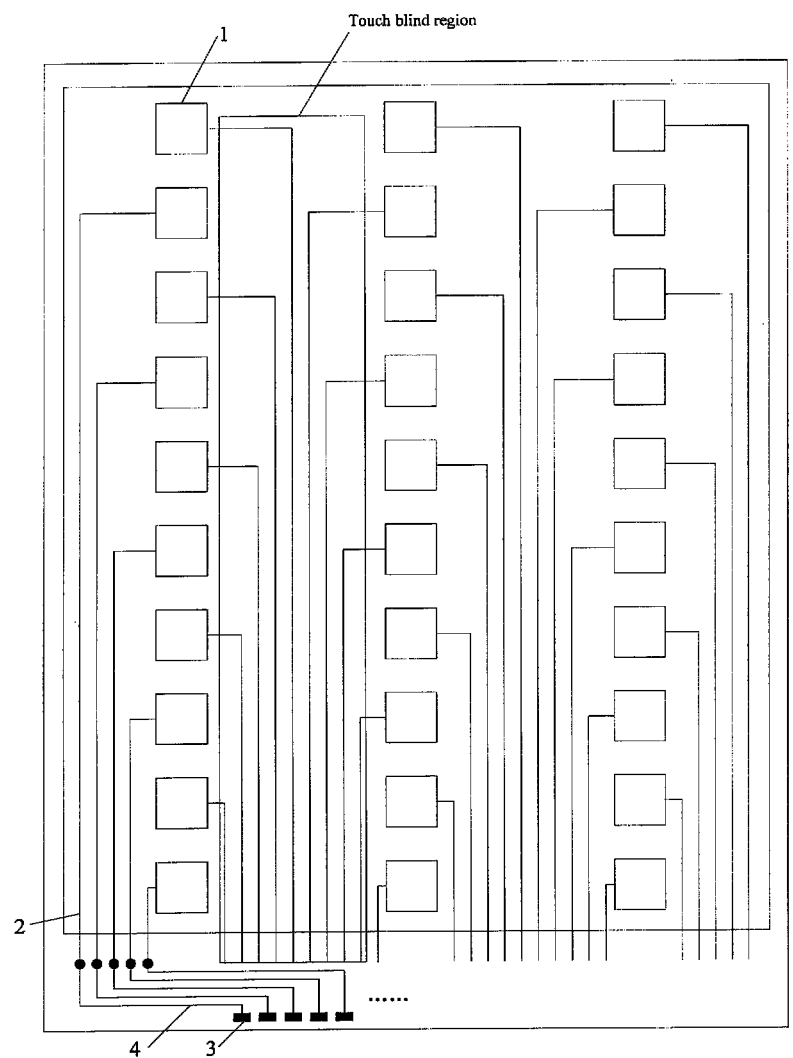
FIG. 1 is a top-view structural schematic diagram of a capacitive touch structure in the prior art.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that direction terms mentioned in the present invention, such as "up" and "down" indicating directions, are merely to explain and understand the present invention with reference to the directions of the drawings, rather than limiting the embodiments of the present invention; moreover, thicknesses and shapes of respective film layers in the drawings are only illustrative of the present invention.

Figure 2:
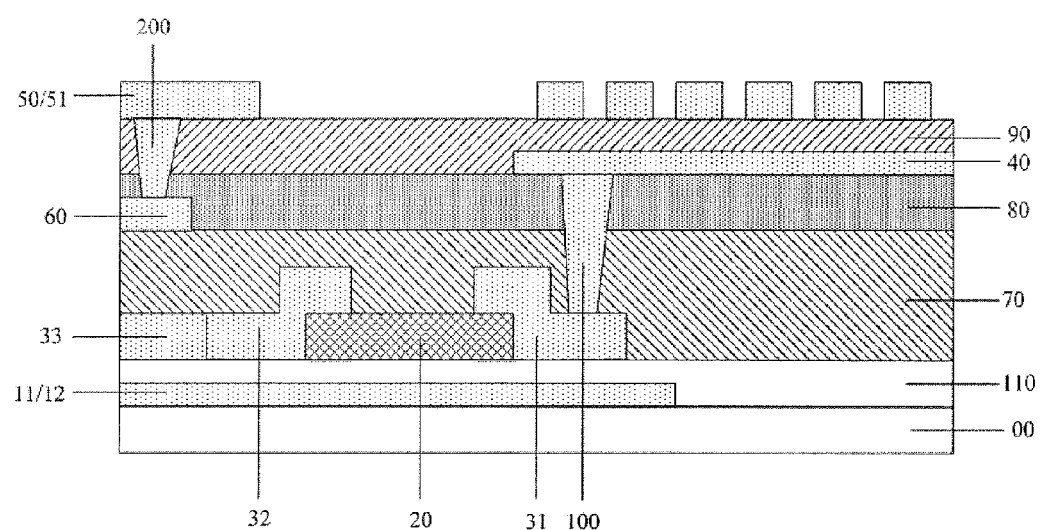
FIG. 2 is a side-view structural schematic diagram of an array substrate in an embodiment of the present invention.

As illustrated in FIG. 2, an embodiment of the present invention provides an array substrate, comprising: a base substrate 00; a gate electrode 11 and a gate line 12 located on the base substrate 00; an active layer 20 located on a film layer where the gate electrode 11 and the gate line 12 are located; a drain electrode 31, a source electrode 32 and a data line 33 located on the active layer 20; a pixel electrode 40 located on a film layer where the drain electrode 31, the source electrode 32 and the data line 33 are located and electrically connected to the drain electrode 40 through a first via hole 100; and a common electrode layer 50 located on a film layer where the pixel electrode 40 is located and electrically insulated from the pixel electrode 40.

The common electrode layer 50 includes a plurality of self-capacitive electrodes 51 disposed on the same layer and mutually insulated;

The array substrate further comprises:

A plurality of conducting lines 60, located on the film layer where the drain electrode 31, the source electrode 32 and the data line 33 are located, and electrically insulated from the drain electrode 31, the source drain 32, the data line 33 and the pixel electrode 40; and, disposed on a layer different from the common electrode layer 50, and each of the conducting lines 60 being electrically connected to a corresponding self-capacitive electrode 51 through a second via hole 200.

In the present description, a film layer where some element is located, for example, refers to a generic term including elements disposed on the same layer with the element. Being located on the film layer where some element is located is not defined as right over the element, and may also be above the element. And being located between the film layer where some element is located and the film layer where another element is located is not defined as a portion directly above (below) the element and directly below (above) the another element, and may also comprise an extended portion of the portion on a surface of the substrate.

In implementation, as compared with the prior art, in the embodiments of the present invention, the common electrode layer included in the array substrate includes a plurality of self-capacitive electrodes disposed on the same layer and mutually insulated, and the array substrate further comprises: a plurality of conducting lines electrically connected to corresponding self-capacitive electrodes, so that touch electrodes (i.e., the self-capacitive electrodes) and the conducting lines in the self-capacitive touch structure are embedded in the array substrate, so as to implement an in-cell touch screen panel.

Since the conducting lines are disposed on a layer different from the common electrode layer, the touch blind region in the self-capacitive touch structure can be eliminated, so as to enhance the touch performance of the touch screen panel containing the self-capacitive touch structure.

In addition, since the common electrode layer included in the array substrate includes a plurality of self-capacitive electrode disposed on the same layer and mutually insulated, the common electrode layer can serve as the touch electrodes in the self-capacitive touch structure, so as to avoid separately providing a film layer where the touch electrodes are located, thereby reducing the number of film layers.

For example, an implementation mode of the self-capacitive electrodes included in the common electrode layer is similar to an implementation mode of the self-capacitive electrodes included in the self-capacitive touch structure in the prior art, which will not repeated here.

For example, a positional connection relationship of the conducting lines in the embodiment of the present invention only needs to meet a condition as follows: located above the film layer where the drain electrode, the source electrode and the data line are located, and electrically insulated from the drain electrode, the source electrode, the data line and the pixel electrode; and disposed on a layer different from the common electrode layer, and each of the conducting lines being electrically connected to a corresponding self-capacitive electrode through a second via hole.

Next, implementation modes of the positional connection relationship between the conducting lines and the plurality of film layers included in the array substrate in the embodiments of the present invention will be illustrated.

I. The film layer where the conducting lines are located is disposed between the film layer where the drain electrode, the source electrode and the data line are located and the common electrode layer.

In implementation, the film layer where the conducting lines are located is disposed between the film layer where the drain electrode, the source electrode and the data line are located and the common electrode layer, which can reduce interference of a human body capacitance to signals transmitted by the conducting lines.

It should be noted that when the film layer where the conducting lines are located is disposed between the film layer where the drain electrode, the source electrode and the data line are located and the common electrode layer, the film layer where the conducting lines are located may be disposed between the film layer where the drain electrode, the source electrode and the data line are located and the film layer where the pixel electrode is located, or may be disposed the film layer where the pixel electrode is located and the common electrode layer, which will be illustrated separately below.

1. The film layer where the conducting lines are located may be disposed between the film layer where the drain electrode, the source electrode and the data line are located and the film layer where the pixel electrode is located.

In implementation, the film layer where the conducting lines are located is disposed between the film layer where the drain electrode, the source electrode and the data line are located and the film layer where the pixel electrode is located, which can ensure a relatively small distance between the film layer where the pixel electrode is located and the common electrode layer, so that it may guarantee that an electric field formed between the pixel electrode and the common electrode layer is strong enough, to improve a display effect.

For example, a first passivation layer including the first via hole is disposed between the film layer where the drain electrode, the source electrode and the data line are located and the film layer where the pixel electrode is located;

The film layer where the conducting lines are located may be disposed between the film layer where the drain electrode, the source electrode and the data line are located and a film layer where the first passivation layer is located, or may be disposed between the film layer where the first passivation layer is located and the film layer where the pixel electrode is located.

For example, as illustrated in FIG. 2, a first passivation layer 70 including the first via hole 100 is disposed between the film layer where the drain electrode 31, the source electrode 32 and the data line 33 are located and the film layer where the pixel electrode 40 is located;

The film layer where the conducting lines 60 are located is disposed between the first passivation layer 70 and the film layer where the pixel electrode 40 is located;

The array substrate further comprises:

A first insulating layer 80, located between the film layer where the conducting lines 60 are located and the film layer where the pixel electrode 40 is located, and including the first via hole 100 and a second via hole 200;

The pixel electrode 40 is electrically connected to the drain electrode 31 through the first via hole 100 included in the first insulating layer 80 and the first via hole 100 included in the first passivation layer 70; and the conducting lines 60 are electrically connected to the self-capacitive electrodes through the second via hole 200 included in the first insulating layer 80.

In implementation, the film layer where the conducing lines are located is disposed between the film layer where the first passivation layer is located and the film layer where the pixel electrode is located, the number of the second via holes can be reduced, so that complexity of a process of manufacturing the array substrate can be simplified.

It should be noted that an implementation mode of the film layer where the conducting lines are located being disposed between the film layer where the drain electrode, the source electrode and the data line are located and the film layer where the first passivation layer is located, is similar to an implementation mode of the film layer where the conducting lines are located being disposed between the film layer where the first passivation layer is located and the film layer where the pixel electrode is located; there is only a difference that, when the film layer where the conducting lines are located is disposed between the film layer where the drain electrode, the source electrode and the data line are located and the film layer where the first passivation layer is located, the first insulating layer should be arranged between the film layer where the drain electrode, the source electrode and the data line are located and the film layer where the conducting lines are located, and the first passivation layer needs to include the second via hole besides the first via hole.

For example, as illustrated in FIG. 2, the film layer where the conducting lines 60 are located is disposed between the film layer where the drain electrode 31, the source electrode 32 and the data line 33 are located and the film layer where the pixel electrode 40 is located;

The array substrate further comprises:

A second passivation layer 90, located between the film layer where the pixel electrode 40 is located and the common electrode layer 50.

In implementation, the second passivation layer is disposed between the film layer where the pixel electrode is located and the common electrode layer, which can ensure that the pixel electrode is electrically insulated from the common electrode layer.

For example, as illustrated in FIG. 2, the array substrate further comprises:

A gate insulating layer 110, disposed between the film layer where the gate electrode 11 and the gate line 12 are located and the active layer 20.

In actual implementation, an implementation mode of the gate insulating layer in the embodiment of the present invention is similar to an implementation mode of the gate insulating layer in the prior art, which will not be repeated here.

2. The film layer where the conducting lines are located is disposed between the film layer where the pixel electrode is located and the common electrode layer.

In implementation, the film layer where the conducting lines are located is disposed between the film layer where the pixel electrode is located and the common electrode layer, which can reduce the number of the second via holes and the number of the first via holes, so as to simplify the complexity of the process of manufacturing the array substrate.

For example, a second passivation layer is disposed between the film layer where the pixel electrode is located and the common electrode layer;

The film layer where the conducting lines are located may be disclosed between the film layer where the pixel electrode is located and the second passivation layer, or may be disposed between the second passivation layer and the common electrode layer.

For example, a second passivation layer is disposed between the film layer where the pixel electrode is located and the common electrode layer;

The film layer where the conducting lines are located is disposed between the second passivation layer and the common electrode layer;

The array substrate further comprises:

A second insulating layer, located between the film layer where the conducting lines are located and the common electrode layer, and including the second via hole;

The conducting lines are electrically connected to the self-capacitive electrodes through the second via hole included in the second insulating layer.

In implementation, the solution in the embodiment of the present invention can be achieved only if the second insulating layer is provided with the second via hole, which thus can reduce the complexity of the process of manufacturing the array substrate.

It should be noted that an implementation mode of the film layer where the conducting lines are located being disposed between the film layer where the pixel electrode is located and the second passivation layer, is similar to an implementation mode of the film layer where the conducting lines are located being disposed between the film layer where the second passivation layer is located and the common electrode layer; there is only a difference that, when the film layer where the conducting lines are located is disposed between the film layer where the pixel electrode is located and the second passivation layer, the second insulating layer should be disposed between the film layer where the pixel electrode is located and the film layer where the conducting lines are located, and does not include a via hole, and the second passivation layer needs to include a second via hole.

II. The film layer where the conducting lines are located is disposed above the common electrode layer.

In implementation, the film layer where the conducting lines are located is disposed above the common electrode layer. It can ensure that a connection relationship among respective film layers included in an existing array substrate shall not be changed.

For example, the array substrate further comprises:

A third insulating layer, located between the film layer where the conducting lines are located and the common electrode layer, and including the second via hole;

The conducting lines are electrically connected to the self-capacitive electrodes through the second via hole included in the third insulating layer.

Next, an implementation mode of the position of the conducting lines in the embodiment of the present invention will be illustrated on a classification basis of the relationship between the position of the conducting lines and the position of the gate line and/or the data line.

For example, orthogonal projections of the conducting lines on the base substrate are located in an orthogonal projection of the data line on the base substrate; and/or The orthogonal projections of the conducting lines on the base substrate are located in an orthogonal projection of the gate line on the base substrate.

Figure 3:
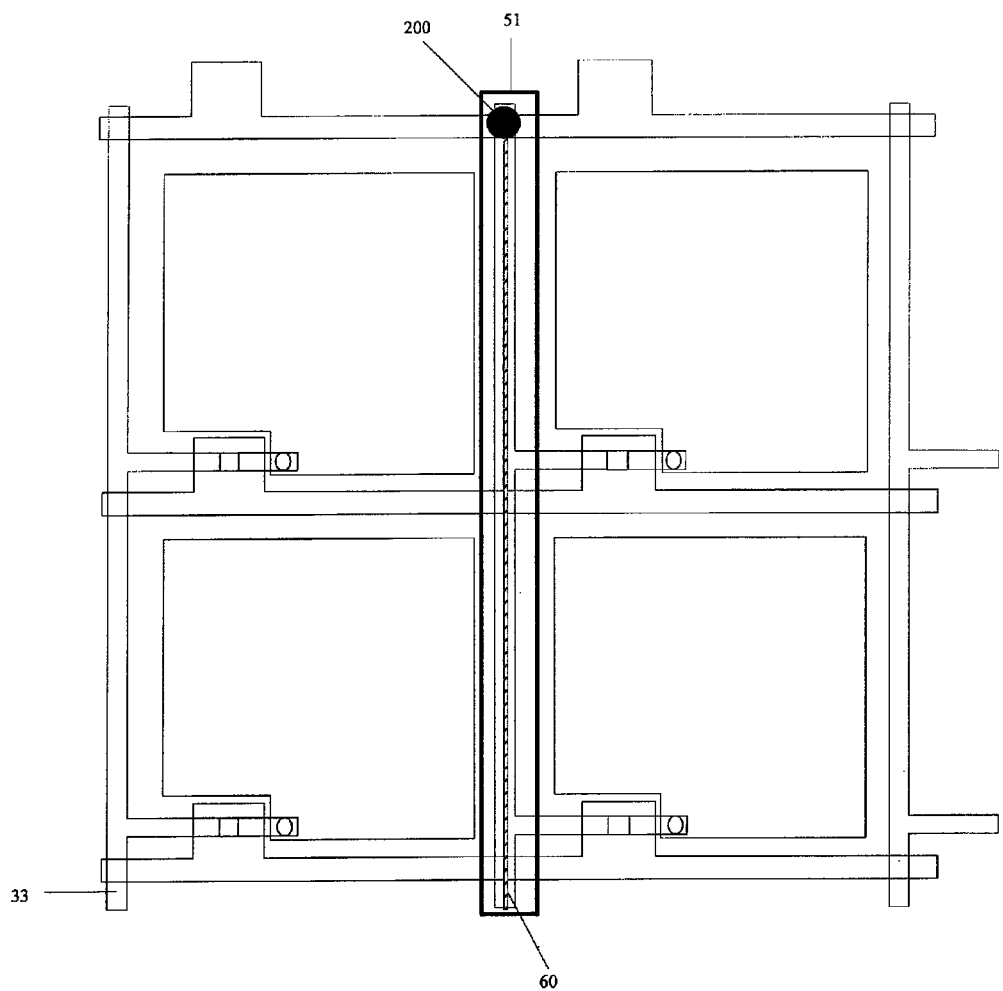
FIG. 3 is a schematic diagram of a positional relationship between conducting lines and a data line in the embodiment of the present invention.

For example, as illustrated in FIG. 3, orthogonal projections of the conducting lines 60 electrically connected to corresponding self-capacitive electrodes 51 through the second via hole 200 on the array substrate (the array substrate is not illustrated in FIG. 3) are located in an orthogonal projection of the data line 33 on the array substrate.

In implementation, the orthogonal projections of the conducting lines on the base substrate are located in the orthogonal projection of the data line on the base substrate; and/or the orthogonal projections of the conducting lines on the base substrate are located in the orthogonal projection of the gate line on the base substrate, which can ensure that an electric field generated by the conducting lines will not affect an electric field at a pixel aperture region, thereby not affecting normal display.

In implementation, the orthogonal projections of the conducting lines on the base substrate are located in the orthogonal projection of the data line on the base substrate; and/or the orthogonal projections of the conducting lines on the base substrate are located in the orthogonal projection of the gate line on the base substrate, which can avoid affecting transmittance.

In implementation, the orthogonal projections of the conducting lines on the base substrate are located in the orthogonal projection of the data line on the base substrate, which can ensure that an extending direction of respective conducting lines is consistent with an extending direction of the data line, conducive to design of narrow frame.

It should be noted that that the implementation mode of the positional relationship between the conducting lines and the gate line and data line may also be other modes, such as, the orthogonal projection(s) of the data line and/or gate line on the base substrate are/is located in the orthogonal projections of the conducting lines on the base substrate; or the orthogonal projections of the conducting lines on the base substrate and the orthogonal projection of the data line and/or gate line on the base substrate partially overlap with each other; or the orthogonal projections of the conducting lines on the base substrate and the orthogonal projection(s) of the data line and/or gate line on the base substrate do not overlap, which will not be repeated here.

For example, similar to the implementation mode of the corresponding relationship between the conducting lines and the self-capacitive electrodes in the prior art, in the embodiment of the present invention, one self-capacitive electrode may be electrically connected to at least one conducting line, and the conductive lines connected to respective self-capacitive electrodes are different conductive lines.

Figure 4:
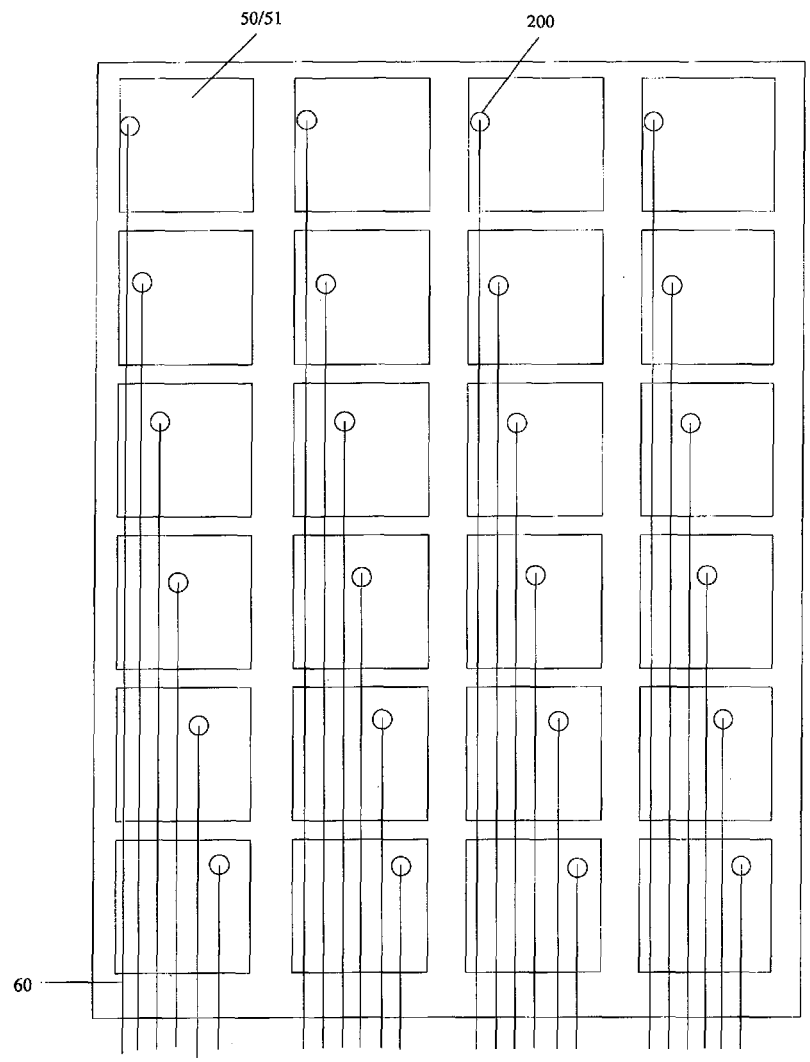
FIG. 4 is a top-view structural schematic diagram of a capacitive touch structure in an embodiment of the present invention.

Next, with FIG. 4 as example, the positional relationship between the conducting lines and the common electrode layer in the embodiment of the present invention will be illustrated.

As illustrated in FIG. 4, the common electrode layer 50 includes a plurality of self-capacitive electrodes 51 disposed in matrix on the same layer and mutually insulated;

One conducting line 60 is electrically connected to one self-capacitive electrode 51, and respective self-capacitive electrodes 51 are electrically connected to different conducting lines 60;

The conducting lines 60 are disposed on a layer different from the common electrode layer 50, and each conducting line 60 is electrically connected to a corresponding self-capacitive electrode 51 through a second via hole 200.

For example, the conducting lines serve as common electrode lines for supplying power to the common electrode layer during a display scanning time period.

In implementation, the conducting lines serve as common electrode lines for supplying power to the common electrode layer during a display scanning time period, which can reduce the number of lines included in the array substrate, to reduce the complexity in manufacturing the array substrate.

In implementation, when the common electrode line is a gate Vcom line disposed on the same layer with the film layer where the gate electrode and the gate line are located, and on a layer different from the common electrode layer, and electrically connected to the common electrode layer through a via hole, the conducting lines serve as the common electrode lines for supplying power to the common electrode layer during the display scanning time period, which also avoids etching via holes in respective film layers between the film layer where the gate electrode and the gate line are located and the common electrode layer to electrically connect the gate Vcom line to the common electrode layer, so as to reduce the number of masks for manufacturing the array substrate, thereby lowering the cost and complexity for manufacturing the array substrate.

Based on the same inventive concept, an embodiment of the present invention further provides a display device, comprising: the array substrate according to the embodiment of the present invention;

The display device may be a mobile phone, a tablet computer, a television, a monitor, a notebook computer, a digital picture frame, a navigator, or any other product or component having a display function.

Implementation of the display device can refer to the above embodiments, which will not be repeated here.

In implementation, since the array substrate according to the embodiment of the present invention is embedded with touch electrodes (i.e., the self-capacitive electrodes) and the conducting lines of the self-capacitive touch structure, the display device comprising the array substrate according to the embodiment of the present invention has a display function and a touch function at the same time.

In implementation, because the array substrate according to the embodiment of the present invention can eliminate the touch blind region in the self-capacitive touch structure, the display device comprising the array substrate according to the embodiment of the present invention may also eliminate the touch blind region, so as to enhance the touch performance;

In implementation, because the array substrate according to the embodiment of the present invention can reduce the number of film layers, the display device comprising the array substrate according to the embodiment of the present invention may also reduce the number of film layers.

For example, the display device further comprises: a color filter substrate arranged opposite to the array substrate; wherein, the color filter substrate includes: a base substrate, a black matrix layer, a color filter layer, a planarization layer and a Post Spacer (PS), stacked sequentially.

For example, an embodiment of the present invention further provides a scanning method of the display device, comprising:

Within one frame, performing touch scanning and display scanning in a time-sharing manner; wherein, During a touch scanning time period, driving signals are applied to respective self-capacitive electrodes in a time-sharing manner through conducting lines connected to the respective self-capacitive electrodes; feedback signals are received from the respective self-capacitive electrodes, and a touch position is determined according to the feedback signals.

In implementation, performing touch scanning and display scanning in a time-sharing manner, can reduce mutual interference between a display signal and a touch signal, to improve picture quality and touch accuracy.

For example, the touch detection ship may apply driving signals to respective self-capacitive electrodes through the conducting lines connected to the respective self-capacitive electrodes in a time-sharing manner; and receive feedback signals from the respective self-capacitive electrodes, and determine a touch position according to the feedback signals.

For example, the touch detection chip is disposed on a circuit board, and in particular, may be disposed on a circuit board provided in a rear portion of the display device, may be disposed on a circuit board provided in a frame portion of the display device, or may be disposed on a flexible circuit board included in the array substrate.

For example, in actual implementation, a display driver chip and the touch detection chip may be integrated into one chip, to reduce the production cost.

Next, the scanning method of the display device in the embodiment of the present invention will be described in detail in conjunction with FIG. 5.

Figure 5:
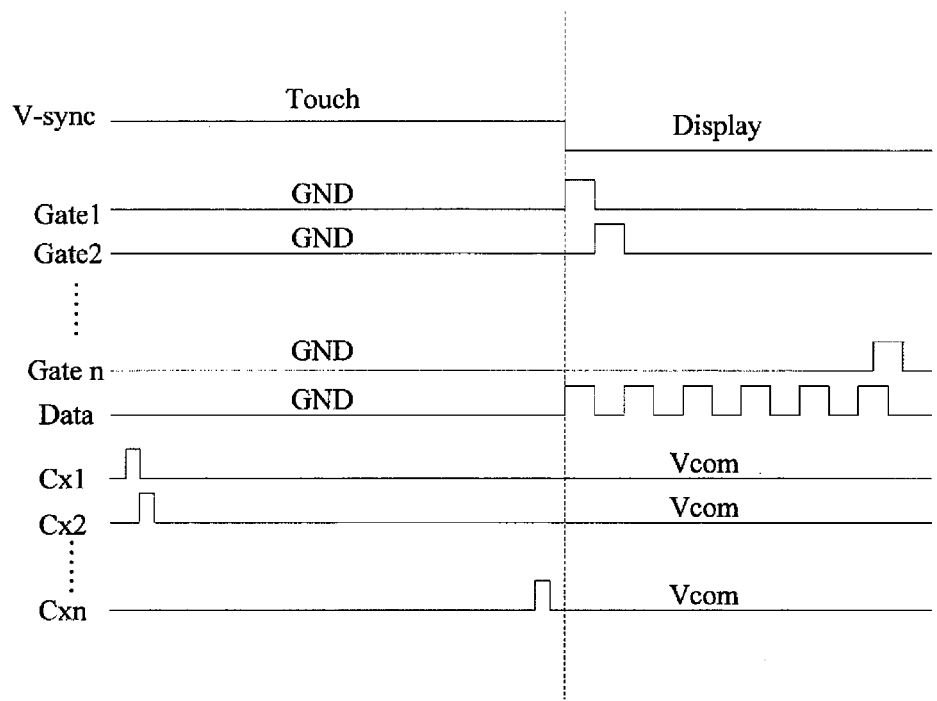
FIG. 5 is a schematic diagram of driving timing of a display device in an embodiment of the present invention.

As illustrated in FIG. 5, the time in which the display device displays each frame (V-sync) is divided into a display scanning time period (Display) and a touch scanning time period (Touch); for example, if the time in which the display device displays one frame is 16.7 ms, of which 5 ms is taken as the touch scanning time period, the remaining 11.7 ms is taken as the display scanning time period; of course, the two time periods may also be adjusted in accordance with the processing capability of the IC chip, which will not be specifically defined here;

During the display scanning time period (Display), gate scanning signals are applied sequentially to each of gate signal lines Gate 1, Gate 2, . . . Gate n in the display device, and a gray-scale signal is applied to a data signal line Data, to implement the display function;

During the touch scanning time period (Touch), the touch detection chip applies driving signals to respective self-capacitive electrodes Cx 1 . . . Cx n in a time-sharing manner; and in the meantime receives feedback signals from the respective self-capacitive electrodes Cx 1 . . . Cx n, and determines a touch position by analyzing the feedback signals of the respective self-capacitive electrodes Cx 1 . . . Cx n, to implement the touch function.

For example, an implementation mode that the touch detection chip determines the touch position by analyzing the feedback signals of the respective self-capacitive electrodes Cx 1 . . . Cx n is similar to an implementation mode in the prior art, which will not be repeated here.

For example, as illustrated in FIG. 5, during the display scanning time period (Display), a voltage Vcom is applied to the respective self-capacitive electrodes.

In implementation, the normal display of the display device can be ensured.

For example, as illustrated in FIG. 5, during the touch scanning time period (Touch), signals GND are applied to the data signal line and the respective gate signal lines.

For example, it may reduce the interference of the signals on the data signal line and the respective gate signal lines to the signals transmitted over the conducting lines.

For example, when driving signals are applied to the respective self-capacitive electrodes in a time-sharing manner, the respective self-capacitive electrodes may be scanned progressively in a lateral direction, to apply the driving signals to the respective self-capacitive electrodes in a time-sharing manner; or the respective self-capacitive electrodes may be scanned progressively in a vertical direction, to apply the driving signals to the respective self-capacitive electrodes in a time-sharing manner.

In actual implementation, the driving signals may also be applied to the respective self-capacitive electrodes in an all diving mode; and the specific implementation mode is similar to that in the prior art, which will not be repeated here.

Based on the same inventive concept, in the meantime, an embodiment of the present invention further provides a method for manufacturing an array substrate, comprising:

Step 601: forming a film layer where the gate electrode and the gate line are located, an active layer, and a film layer where the drain electrode, the source electrode and the data line are located, on a base substrate sequentially;

Step 602: forming a pixel electrode electrically connected to the drain electrode through a first via hole, a common electrode layer located on the film layer where the pixel electrode is located and electrically insulated from the pixel electrode, and a plurality of conducting lines, on the film layer where the drain electrode, the source electrode and the data line are located;

The common electrode layer includes a plurality of self-capacitive electrodes disposed on the same layer and mutually insulated; the conducting lines are electrically insulated from the drain electrode, the source electrode, the data line and the pixel electrode, and are disposed on a layer different from the common electrode layer; and each of the conducting lines is connected to a corresponding self-capacitive electrode through a second via hole.

Embodiment I

In Embodiment I of the present invention, the method for manufacturing the array substrate illustrated in FIG. 2 will be illustrated in detail.

Preferably, the manufacturing method of the array substrate according to the embodiment of the present invention, comprises:

Step 1: as illustrated in FIG. 2, forming a gate electrode 11 and a gate line 12 on a base substrate 00;

The gate electrode and gate line electrically connected with each other are formed on the base substrate by one Gate Mask (gate etching) process.

In the prior art, a gate Vcom line disposed on the same layer with the gate electrode and the gate line and electrically insulated from them is further formed on the base substrate by one Gate Mask process;

However, in the embodiment of the present invention, the gate Vcom line may or may not be made.

Step 2: as illustrated in FIG. 2, a gate insulting layer 110 is formed on the film layer where the gate electrode 11 and the gate line 12 are located;

Step 3: as illustrated in FIG. 2, forming an active layer 20 on the gate insulating layer 110;

The active layer is formed on the gate insulating layer 11 by one Active Mask (active layer etching) process.

In the prior art, after the Active Mask process, one GI Mask (gate insulating layer etching) process should be further performed, to form a via hole exposing the gate Vcom line in the gate insulating layer.

However, in the embodiment of the present invention, when the gate Vcom line is not made, it is unnecessary to perform the GI Mask process.

Step 4: as illustrated in FIG. 2, forming a drain electrode 31, a source electrode 32 and a data line 33 on the active layer 20;

The drain electrode, the source electrode and the data line are formed on the active layer by one SD Mask (source and drain etching) process.

Step 5: as illustrated in FIG. 2, forming a first passivation layer 70 including a first via hole 100 exposing the drain electrode 31 on the film layer where the drain electrode 31, the source electrode 32 and the data line 33 are located;

The first passivation layer including the first via hole exposing the drain electrode is formed by one PVXI Mask (first passivation layer etching) process.

In the prior art, it is still necessary to form the via hole exposing the gate Vcom line in the first passivation layer during the PVX1 Mask process;

However, in the embodiment of the present invention, when the gate Vcom line is not made, it is unnecessary to form the via hole exposing the gate Vcom line in the first passivation layer.

Step 6: as illustrated in FIG. 2, forming conducting lines 60 on the first passivation layer 70;

The conducting lines are formed by one Metal Mask (conducting line etching) process.

Step 7: as illustrated in FIG. 2, forming a first insulating layer 80 on the film layer where the conducting lines 60 are located, the first insulating layer 80 including the first via hole 100 exposing the drain electrode 31, and a second via hole 200 exposing the conducting lines 60;

The first insulating layer including the first via hole and the second via hole are formed by one I Mask (insulating layer etching) process.

In the embodiment of the present invention, when the gate Vcom line is made, it is necessary to form the via hole exposing the gate Vcom line in the first insulating layer.

Step 8: as illustrated in FIG. 2, forming a pixel electrode 40 on the first insulating layer 80, the pixel electrode 40 being electrically connected to the drain electrode 31 through the first via hole 100 included in the first insulating layer 80 and the first via hole 100 included in the first passivation layer 70;

The pixel electrode is formed by one $1^{st}$ ITO Mask (pixel electrode etching) process.

Step 9: as illustrated in FIG. 2, forming a second passivation layer 90 including a second via hole 200 on the film layer where the pixel electrode 40 is located;

The second passivation layer including the second via hole is formed by one PVX2 Mask (second passivation layer etching) process.

In the prior art, it is still necessary to form a via hole exposing the gate Vcom line in the second passivation layer during the PVX2 Mask process;

However, in the embodiment of the present invention, when the gate Vcom line is not made, it is unnecessary to form a via hole exposing the gate Vcom line in the second passivation layer Step 10: as illustrated in FIG. 2, forming a common electrode layer 50 including a plurality of self-capacitive electrodes 51 disposed on the same layer and mutually insulated on the second passivation layer; the conducting lines 60 being electrically connected to the corresponding self-capacitive electrodes 51 through the second via hole 200 included in the first insulating layer 80 and the second via hole 200 included in the second passivation layer 90.

The common electrode layer is formed by one $2^{nd}$ ITO Mask (common electrode layer etching) process.

Embodiment II

In Embodiment II of the present invention, a method for manufacturing a color filter substrate disposed opposite to the array substrate will be illustrated in detail.

The manufacturing method of the color filter substrate in the embodiment of the present invention, comprises:

Step 1: forming a black matrix layer on a base substrate;

The black matrix layer is formed on the base substrate by one BM Mask (black matrix layer etching) process.

Step 2: forming an RGB (red green blue) color filter layer on the black matrix layer;

The RGB color filter layer is formed on the black matrix layer by an R mask (red sub-pixel unit etching) process, a G Mask (green sub-pixel unit etching) process, and a B Mask (blue sub-pixel unit etching) process.

Step 3: forming a planarization layer on the RGB color filter layer;

Step 4: forming a PS on the planarization layer.

The PS is formed by one PS (post spacer etching) Mask process.

Although preferred embodiments of the present invention have been described, once the basic inventive concept is known, those skilled in the art can make other changes and modifications to these embodiments. Therefore, the appended claims are intended to include the preferred embodiments and all the changes and modifications falling within the scope of the present invention.

The foregoing embodiments merely are exemplary embodiments of the invention, and not intended to define the scope of the invention, and the scope of the invention is determined by the appended claims. The present application claims priority of Chinese Patent Application No. 201410239888.4 filed on May 30, 2014, the disclosure of which is incorporated herein by reference in its entirety as part of the present application.

What is claimed is:

1. An array substrate, comprising: a base substrate; a gate electrode and a gate line located on the base substrate; an active layer located on a film layer where the gate electrode and the gate line are located; a drain electrode, a source electrode and a data line located on the active layer; a pixel electrode located on a film layer where the drain electrode, the source electrode and the data line are located and electrically connected to the drain electrode through a first via hole; and a common electrode layer located on a film layer where the pixel electrode is located and electrically insulated from the pixel electrode; wherein, the common electrode layer includes a plurality of self-capacitive electrodes disposed on a same layer and mutually insulated;

the array substrate further comprises:

a plurality of conducting lines, located on the film layer where the drain electrode, the source electrode and the data line are located, and electrically insulated from the drain electrode, the source drain, the data line and the pixel electrode; and, disposed on a layer different from the common electrode layer, and each of the conducting lines being electrically connected to a corresponding self-capacitive electrode through a second via hole.

2. The array substrate according to claim 1, wherein, a film layer where the conducting lines are located is disposed between the film layer where the drain electrode, the source electrode and the data line are located and the common electrode layer.

3. The array substrate according to claim 2, wherein, the film layer where the conducting lines are located is disposed between the film layer where the drain electrode, the source electrode and the data line are located and the film layer where the pixel electrode is located.

4. The array substrate according to claim 3, wherein, a first passivation layer is disposed between the film layer where the drain electrode, the source electrode and the data line are located and the film layer where the pixel electrode is located, and the first via hole runs through the first passivation layer;

the film layer where the conducting lines are located is disposed between the first passivation layer and the film layer where the pixel electrode is located;

the array substrate further comprises:

a first insulating layer, located between the film layer where the conducting lines are located and the film layer where the pixel electrode is located, both the first via hole and the second via hole running through the first insulating layer;

wherein, the pixel electrode is electrically connected to the drain electrode through the first via hole.

5. The array substrate according to claim 2, wherein, the film layer where the conducting lines are located is disposed between the film layer where the pixel electrode is located and the common electrode layer.

6. The array substrate according to claim 5, wherein, a second passivation layer is disposed between the film layer where the pixel electrode is located and the common electrode layer;

the film layer where the conducting lines are located is disposed between the second passivation layer and the common electrode layer;

the array substrate further comprises:
a second insulating layer, located between the film layer where the conducting lines are located and the common electrode layer, the second via hole running through the second insulating layer.

7. The array substrate according to claim 1, wherein, the film layer where the conducting lines are located is disposed above the common electrode layer.

8. The array substrate according to claim 7, further comprising:
a third insulating layer, located between the film layer where the conducting lines are located and the common electrode layer, the second via hole running through the third insulating layer.

9. The array substrate according to claim 1, wherein, orthogonal projections of the conducting lines on the base substrate are located in an orthogonal projection of the data line on the base substrate; and/or
the orthogonal projections of the conducting lines on the base substrate are located in an orthogonal projection of the gate line on the base substrate.

10. The array substrate according to claim 1, wherein, the conducting lines serve as common electrode lines for supplying power to the common electrode layer during a display scanning time period.

11. A display device, comprising the array substrate according to claim 1.

12. The display device according to claim 11, wherein, a film layer where the conducting lines are located is disposed between the film layer where the drain electrode, the source electrode and the data line are located and the common electrode layer.

13. The display device according to claim 12, wherein, the film layer where the conducting lines are located is disposed between the film layer where the drain electrode, the source electrode and the data line are located and the film layer where the pixel electrode is located.

14. The display device according to claim 13, wherein, a first passivation layer is disposed between the film layer where the drain electrode, the source electrode and the data line are located and the film layer where the pixel electrode is located, and the first via hole runs through the first passivation layer;
the film layer where the conducting lines are located is disposed between the first passivation layer and the film layer where the pixel electrode is located;
the array substrate further comprises:
a first insulating layer, located between the film layer where the conducting lines are located and the film layer where the pixel electrode is located, both the first via hole and the second via hole running through the first insulating layer;
wherein, the pixel electrode is electrically connected to the drain electrode through the first via hole.

15. The display device according to claim 12, wherein, the film layer where the conducting lines are located is disposed between the film layer where the pixel electrode is located and the common electrode layer.

16. The display device according to claim 15, wherein, a second passivation layer is disposed between the film layer where the pixel electrode is located and the common electrode layer;
the film layer where the conducting lines are located is disposed between the second passivation layer and the common electrode layer;
the array substrate further comprises:
a second insulating layer, located between the film layer where the conducting lines are located and the common electrode layer, the second via hole running through the second insulating layer.

17. The display device according to claim 11, wherein, the film layer where the conducting lines are located is disposed above the common electrode layer.

18. The display device according to claim 17, further comprising:
a third insulating layer, located between the film layer where the conducting lines are located and the common electrode layer, the second via hole running through the third insulating layer.

19. The display device according to claim 11, wherein, orthogonal projections of the conducting lines on the base substrate are located in an orthogonal projection of the data line on the base substrate; and/or
the orthogonal projections of the conducting lines on the base substrate are located in an orthogonal projection of the gate line on the base substrate.

20. A manufacturing method of an array substrate, comprising:
forming a film layer where a gate electrode and a gate line are located, an active layer, and a film layer where a drain electrode, a source electrode and a data line are located, on a base substrate sequentially;
forming a pixel electrode electrically connected to the drain electrode through a first via hole, a common electrode layer located on a film layer where the pixel electrode is located and electrically insulated from the pixel electrode, and a plurality of conducting lines, on the film layer where the drain electrode, the source electrode and the data line are located;
wherein, the common electrode layer includes a plurality of self-capacitive electrodes disposed on a same layer and mutually insulated; the conducting lines are electrically insulated from the drain electrode, the source electrode, the data line and the pixel electrode, and are disposed on a layer different from the common electrode layer; and each of the conducting lines is connected to a corresponding self-capacitive electrode through a second via hole.

* * * * *